United States Patent
Lu

(10) Patent No.: US 10,270,471 B2
(45) Date of Patent: Apr. 23, 2019

(54) MEMORY SYSTEM HAVING ECC SELF-CHECKING FUNCTION AND ASSOCIATED METHOD

(71) Applicant: TAIWAN SEMICONDUCTOR MANUFACTURING COMPANY LTD., Hsinchu (TW)

(72) Inventor: Shih-Lien Linus Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 2 days.

(21) Appl. No.: 15/226,139

(22) Filed: Aug. 2, 2016

(65) Prior Publication Data

US 2018/0039540 A1 Feb. 8, 2018

(51) Int. Cl.
| | | |
|---|---|---|
| *G06F 11/10* | (2006.01) | |
| *H03M 13/15* | (2006.01) | |
| *G06F 11/00* | (2006.01) | |
| *H03M 13/00* | (2006.01) | |
| *H04L 1/00* | (2006.01) | |

(52) U.S. Cl.
CPC ..... *H03M 13/1575* (2013.01); *G06F 11/1048* (2013.01)

(58) Field of Classification Search
None
See application file for complete search history.

(56) References Cited

U.S. PATENT DOCUMENTS

| | | | | | |
|---|---|---|---|---|---|
| 4,736,376 | A | * | 4/1988 | Stiffler | ............ G06F 11/10 714/703 |
| 5,515,383 | A | * | 5/1996 | Katoozi | ......... G01B 31/318385 714/732 |
| 8,856,629 | B2 | * | 10/2014 | Kern | ................ G06F 11/2215 714/732 |
| 8,918,679 | B2 | * | 12/2014 | Janke | ................ G06F 11/2215 714/23 |
| 2002/0157044 | A1 | * | 10/2002 | Byrd | ................ H04L 1/004 714/703 |
| 2015/0155058 | A1 | * | 6/2015 | Weng | ............... G06F 11/1044 714/721 |
| 2017/0262333 | A1 | * | 9/2017 | Weng | ............... G06F 11/1044 |

OTHER PUBLICATIONS

H. C. Lu and J. F. Li, "A programmable online/off-line built-in self-test scheme for RAMs with ECC," 2009 IEEE International Symposium on Circuits and Systems, Taipei, 2009, pp. 1997-2000. doi: 10.1109/ISCAS.2009.5118183.*

* cited by examiner

*Primary Examiner* — Justin R Knapp
(74) *Attorney, Agent, or Firm* — WPAT, P.C., Intellectual Property Attorneys; Anthony King

(57) ABSTRACT

A memory system having an error correction codes (ECC) self-checking function is disclosed. The memory system includes: an ECC encoder, used to convert input information bits into a codeword; a memory, coupled to the ECC encoder, the memory being used to store the codeword; and an ECC decoder, coupled to the memory and the ECC encoder, the ECC decoder being used to generate a syndrome of the codeword; wherein when the memory system is operated in an on-line self-checking mode and the codeword is fed into the memory from the ECC encoder, the codeword is as well fed into the ECC decoder from the ECC encoder to generate the syndrome.

20 Claims, 4 Drawing Sheets

MEMORY SYSTEM HAVING ECC SELF-CHECKING FUNCTION AND ASSOCIATED METHOD

BACKGROUND

Memory is widely used to store information (both data and program) in a digital system. During the operation of the system, information (bits) stored in the memory may be corrupted due to various reasons. One possible cause of the corruption is due to environmental events both internal to the memory and outside of the memory. One such outside event is a particle strike. There are other reasons which cause the corruption (failure) of bits besides environmental events. When a bit is corrupted, information stored is lost resulting system failure or data lost. Therefore it is important to protect the integrity of the memory content.

Various means for protecting the memory content from corruption have been used. Error correction codes (ECC) have the advantage of being able to detect errors in a codeword (both the data field and the check bits), and also to correct errors. However, a fault that occurs inside an ECC encoder/decoder and correction circuit may lead to erroneous detection results of the ECC decoder. In other words, the fault in the ECC encoder/decoder and correction circuit itself is generally unprotected by error correcting codes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
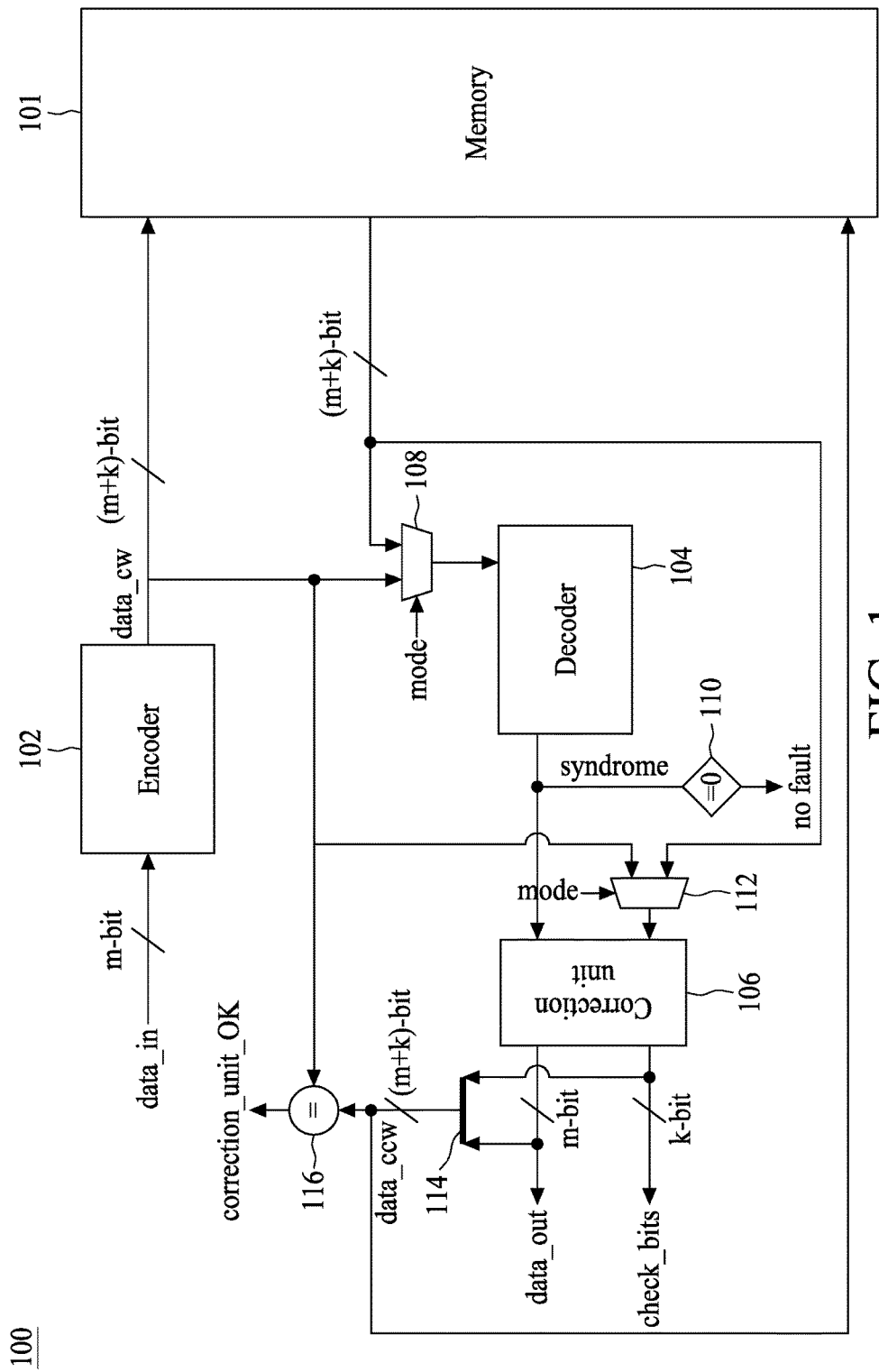
FIG. 1 is a diagram illustrating a memory system 100 having an ECC self-checking function in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

There are many types of semiconductor memories both in circuit construction and memory storage materials used, such as dynamic random-access memory (DRAM), static random-access memory (SRAM), magnetic tunnel junction random-access memory (MRAM), and resistive random-access memory (ReRAM) etc. Memory is usually arranged in a 2-dimensional array. A memory array may be a device of itself or embedded in another device, can include many memory cells. Each memory cell can typically store one bit of information by holding or not holding a charge in, for example, a capacitor. The presence or absence of a charge indicates, for example, logic 1 when a charge is stored, and logic 0 when no charge is stored. Electrical disturbance, such as interference from noise or radiation, can change the contents of one or more memory cells or interfere with the circuitry used to read and write data to the memory cells. Furthermore, memory devices are being designed to operate at increasingly higher throughput rates and lower power consumption, which can lead to increasingly higher bit error rates. A bit error can cause corruption of data, security vulnerabilities, or a system crash.

Error correcting code (ECC) can be used to detect and correct bit errors stored in a memory. ECC encodes data by generating ECC check bits, e.g., redundancy bits or parity bits, that are stored along with the data in a memory device. Data and check bits together formed the codeword. For example, an ECC that generates 8 parity bits for 64 bits of data can usually detect two bit errors and correct one bit error in the 64 bits of data, known as a SECDED code, single-error correcting (SEC) and double-error detecting (DED).

There needs to be some additional memory space to store the check bits besides. For memory array in a stone along device (chip), typically, an additional or more memory device(s) (chip(s)) is (are) used in a system to keep check bits thus providing ECC capability. For memory array embedded in another IC chip, additional columns, usually, are added to store the check bits. Thus a codeword (say, n-bits) is made out of data bits (say, m-bits) and check bits (say, k-bits) (n=m+k). For example, an ECC memory that can provide 8-bit parity for each 32-bit data word may include a 40-bit wide interface to access a 40-bit codeword with 32-bit data. Similarly, an ECC memory that can provide 8-bit parity for each 64-bit data word may include a 72-bit wide interface to access a 72-bit codeword with 64-bit data.

However, the ECC encoding/decoding system can only detect and correct errors occurs in or associated with the memory array. When there is an error due to a hardware fault inside the ECC logic encoding/decoding circuit or the correction logic, it will be unable to identify such an error by using the existing error correcting codes. The concept of the present disclosure is to provide a novel ECC encoding/decoding system that is able to on-line identify and report faults induced inside the ECC encoding/decoding circuit and/or correcting logic.

FIG. 1 is a diagram illustrating a memory system 100 having an ECC self-checking function in accordance with an exemplary embodiment of the present disclosure. The memory system 100 includes an ECC encoder 102, an ECC decoder 104, an ECC correction unit 106 and a memory 101. The ECC encoder 102 is used to convert a data sequence corresponding to input information bits data_in on a transmission side among received data into an encoded codeword. In the exemplary embodiment, input information bits data_in may be an m-tuple vector comprised of m bits. Encoded codeword data_cw may be an (m+k)-tuple vector comprised of (m+k) bits. The encoded codeword data_cw may be composed of the input information bits data_in and parity bits. The parity bits may be a k-tuple vector comprised of k bits.

As described herein, the memory 101 may include any device that stores information. For example, the memory 101 may include a flash memory, magnetic disk, a bubble memory, a first-in-first out (FIFO) memory, a dual-port memory, a random access memory (RAM), a dynamic memory, a static memory, a compact disk (CD), a DVD, a holographic optical disk, and the like.

As described herein, the ECC encoder 102 may include any technique or algorithm that adds redundancy to information to detect or correct errors. For example, error correcting codes can include non-binary block codes such as the Reed-Solomon [255, 239] or [255, 221] codes, linear block codes such as Hamming codes and Bose-Chaudhuri-Hocquenghem (BCH) codes, cyclic Hamming codes, Hadamard codes such as the Hadamard [16, 5] code, Golay codes such as the Golay [23, 12] code, the extended Golay [24, 12] code, or the cyclic Golay [24, 12] code, maximum length shift-register codes, a Reed-Muller code, an alternate code, a Goppa code, binary and non-binary convolutional codes, dual-K codes, turbo codes, turbo product codes, LDPC codes, concatenated codes made from enclosing one code inside another, and the like. The strength of the error correcting code can be adjusted as needed by adding more parity bits. For example, the strength of a code can be measured by a minimum Hamming distance.

Figure 2:
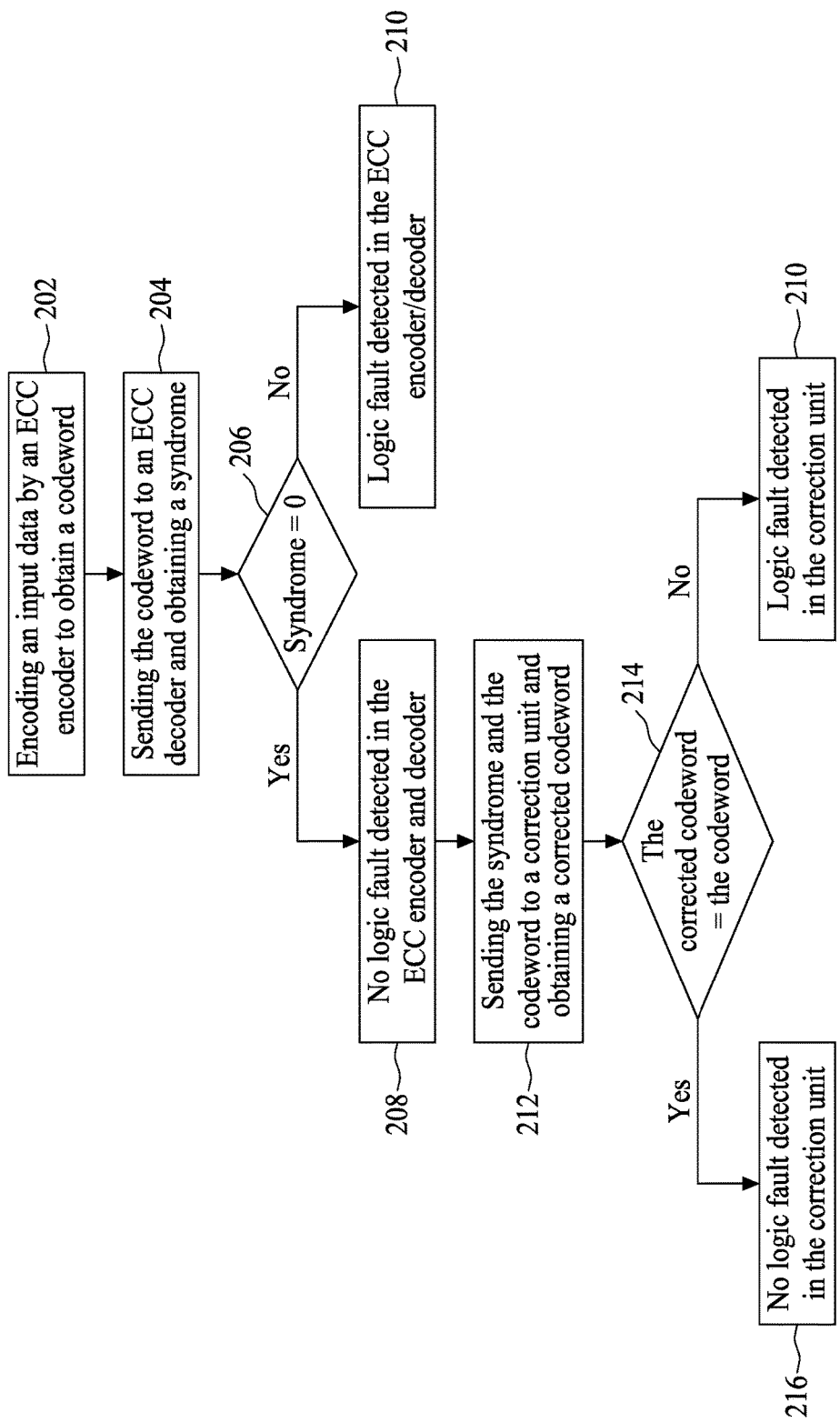
FIG. 2 is a flow chart illustrating an ECC self-check method in accordance with an exemplary embodiment of the present disclosure.

FIG. 2 is a flow chart illustrating an ECC self-check method in accordance with an exemplary embodiment of the present disclosure. In operation 202, also referring to FIG. 1, the ECC encoder 102 may perform matrix multiplication on the input information bits data_in and a predefined generator matrix determined according to the type of the employed ECC. The output of the ECC encoder 102 is a codeword data_cw. For example, the predefined generator matrix may be the 4×7 generator matrix G of a (7, 4) Hamming code where there are 4 data bits and 3 check bits forming a codeword of length 7. In some embodiments, the predefined generator matrix may be a 4×7 generator matrix $G_{syst}$ of a (7, 4) Hamming code in a systematic form.

In a memory write operation, the codeword data_cw is fed into the memory 101 after being generated by upstream circuits. In order to on-the-fly or on-line check the correctness of the ECC encoder 102, the ECC decoder 104 and the ECC correction unit 106, the codeword data_cw may be simultaneously fed into the ECC decoder 104 during the write operation via a mux 108 when an ECC self-checking mode is enabled as indicated in operation 204. For example, the ECC self-checking mode is enabled when the control signal "mode" is configured to be at a logical "1" level; and the ECC self-checking mode is disabled when the control signal "mode" is configured to be at a logical "0" level. However, this is not a limitation of the present disclosure.

The concept of the embodiment is to utilize the self-complement property of the ECC encoder 102 and the ECC decoder 104 to detect possible faults in the circuit. That is, once a code is generated with the ECC encoder 102, not including other faults (such as faults in the memory) in the path, the codeword data_cw should go through the ECC decoder 104 with an error-free result. To avoid contamination of other circuits in the memory 101, the codeword data_cw used is not from the memory 100 but the one generated from the ECC encoder 102 directly.

The ECC decoder 104 is coupled to the ECC encoder 102. In the exemplary embodiment, the ECC decoder 104 may be used to compute a syndrome of the codeword data_cw. In particular, the ECC decoder 104 may perform matrix multiplication on a predefined parity-check matrix and the codeword data_cw. The predefined parity-check matrix may be determined according to the type of the employed ECC. For example, the predefined parity-check matrix may be the 7×3 parity-check matrix H of a (7, 4) Hamming code. Accordingly, the ECC decoder 104 outputs a 3-tuple vector comprised of 3 bits. When there is a fault in the ECC encoder 102, the encoded codeword data_cw is highly likely to be an invalid codeword. The ECC decoder 104 is for checking whether the encoded codeword data_cw is a valid codeword based on the principle of the (7, 4) Hamming code. When the 3-tuple vector, i.e. the syndrome, produced by the ECC decoder 104 does not equal to (0, 0, 0) in operation 206, the encoded codeword data_cw is determined to be an invalid codeword as indicated by a checking logic 110. In this case, the flow enters operation 210 representing there may be at least one fault in the ECC encoder 102 and/or the ECC decoder 104. On the other hand, when the 3-tuple vector. i.e. the syndrome, produced by the ECC decoder 104 equals to (0, 0, 0), the encoded codeword data_cw is determined to be a valid codeword. In this case, the flow enters operation 208 representing there may be no fault in the ECC encoder 102 and the ECC decoder 104 as indicated by the checking logic 110.

Once the ECC encoder 102 is verified, then a golden reference for the codeword data_cw is obtained. The golden reference may be used to compare with the output of the correction unit 106. In operation 212, the syndrome (k bits) and the codeword data_cw (m+k bits) are sent to the correction unit 106. The correction unit 106 produces a corrected codeword data_ccw including data (m bits data_out) and check bits (k bits check_bits) according to the syndrome. As illustrated, the corrected codeword data_ccw is obtained by combining the data and check bits output from the correction unit 106 at node 114. In operation 214, the codeword data_cw is compared with the corrected codeword data_ccw via a comparator 116. If the codeword data_cw and the corrected codeword data_ccw are different, a fault is detected in the correction unit 106 as shown in operation 218; else there is no logic fault detected as shown in operation 216.

In some embodiments, the verification of the mux 108, the checking logic 110, the mux 112 and the comparator 116 may be also accomplished by circuit duplication or using other self-checking embedded logic design. For example, to verify the mux 108, the result of the mux 108 may be compared with a result produced by a duplicated mux, or implementing the mux 108 by employing a mux having a self-checking function.

Comparing the memory system 100 with some existing structures like a fully redundant ECC encoder/decoder that also attempts to improve the self-checking ability of an ECC encoder/decoder, the memory system 100 is easier to implement, and yields lower gate count than the fully redundant ECC encoder/decoder. Thereby the complexity and cost of the memory system 100 can be kept relatively low.

Figure 3:
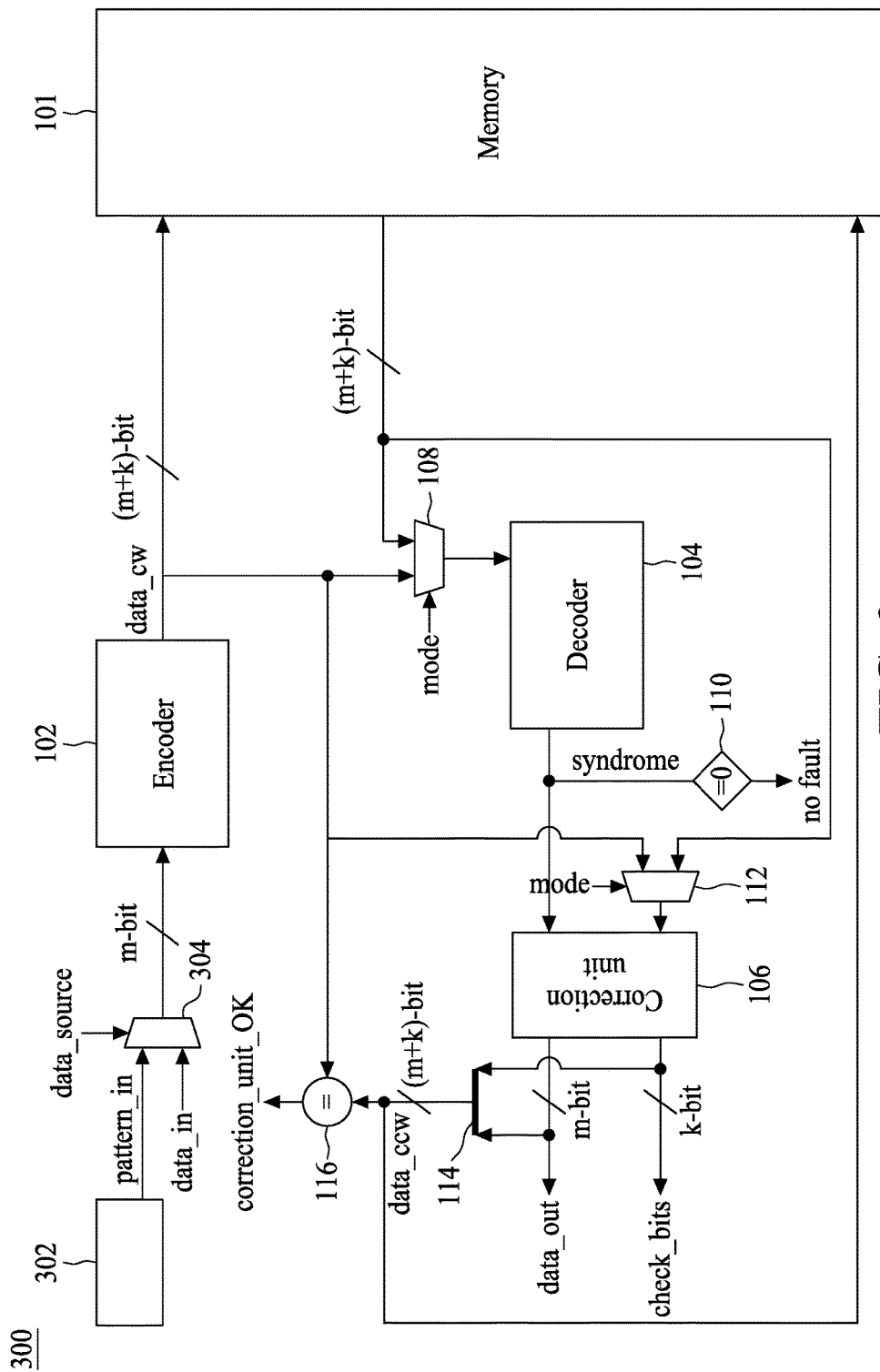
FIG. 3 is a diagram illustrating a memory system 300 having an ECC self-checking function in accordance with another exemplary embodiment of the present disclosure.

FIG. 3 is a diagram illustrating a memory system 300 having an ECC self-checking function in accordance with another exemplary embodiment of the present disclosure. The memory system 300 is the same as the memory system 200 except that the memory system 300 further includes a pattern generator 302 to produce predetermined input information bits pattern_in into the ECC encoder 102. A mux 304 is located preceding the ECC encoder 102 for selectively feeding the input information bits data_in or pattern_in into the ECC encoder 102 according to a control signal data_source. For example, the predetermined input information bits pattern_in is fed into the ECC encoder 102 when the control signal data_source is configured to be at a logical "1" level; and the input information bits data_in is fed into the ECC encoder 102 when the control signal data_source is configured to be at a logical "0" level. However, this is not a limitation of the present disclosure. In some embodiments, the pattern generator 302 may determine the predetermined input information bits pattern_in from all input patterns. In some embodiments, the pattern generator 302 may determine the predetermined input information bits pattern_in in an exhaustive way. In some embodiments, the pattern generator 302 may determine the predetermined input information bits pattern_in in a random way. In some embodiments, the pattern generator 302 may determine the predetermined input information bits pattern_in from at least a subset of all possibilities. The subset may be random patterns, exhaustive combinations of certain input fields and/or input pins, patterns designed to toggle specific nodes in the ECC encoder 102, or patterns determined algorithmically to give the largest coverage while minimizing the number of patterns.

When the memory 101 is not performing a write operation (the input information bits data_in are not toggling), the memory system 300 may enter into an off-line self-checking mode by introducing the predetermined input information bits pattern_in into the ECC encoder 102. In the off-line self-checking mode, the coverage of self-checking can be controllable compared to the on-the-fly mode because the predetermined input information bits pattern_in may be systematically generated as mentioned above.

Figure 4:
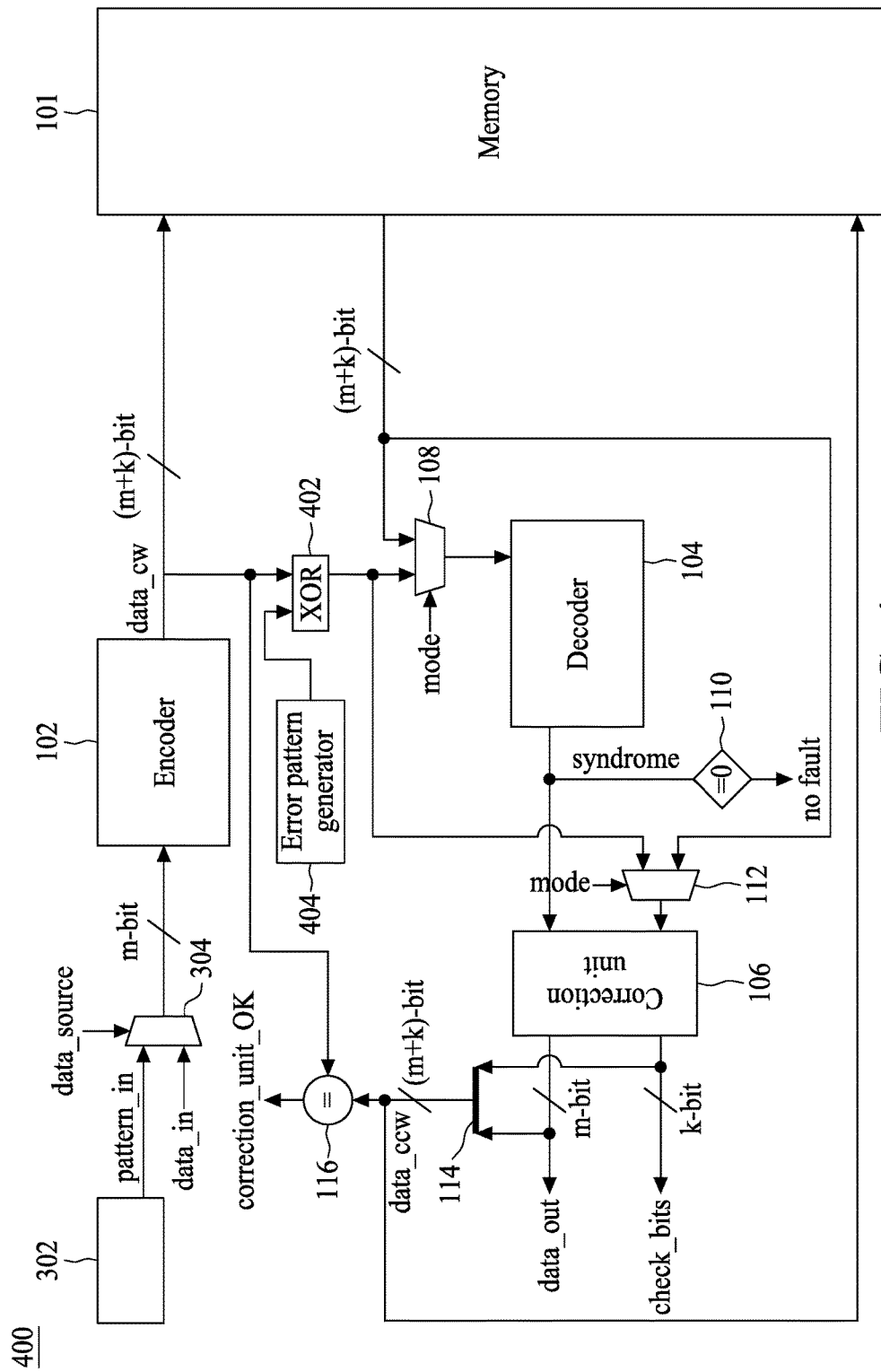
FIG. 4 is a diagram illustrating a memory system 400 having an ECC self-checking function in accordance with still another exemplary embodiment of the present disclosure.

FIG. 4 is a diagram illustrating a memory system 400 having an ECC self-checking function in accordance with still another exemplary embodiment of the present disclosure. The memory system 400 is the same as the memory system 300 except that the memory system 300 includes an error pattern generator 404 to produce predetermined error patterns in order to deliberately contaminate the encoded codeword data_cw generated by the ECC encoder 102 via an XOR (exclusive OR) unit 402. In some embodiments, the error pattern generator 404 may determine the predetermined error patterns in an exhaustive way. In some embodiments, the error pattern generator 404 may determine the predetermined error patterns in a random way. In some embodiments, the error pattern generator 404 may determine the predetermined error patterns from at least a subset of all possibilities. The subset may be random patterns, exhaustive combinations of certain input fields and/or input pins, or patterns designed to toggle specific nodes in the the correction unit 106. The codeword data_cw is compared with the corrected codeword data_ccw via the comparator 116. If the codeword data_cw and the corrected codeword data_ccw are different, a fault is detected in the correction unit 106 as shown in operation 218; else there is no logic fault detected. In the case where the encoded codeword data cw is contaminated by the error pattern generator 404 via the XOR unit 402, the corresponding syndrome produced by the decoder 104 is not supposed to be all zeros. In other words, an all-zero syndrome may indicate at least one logic fault in the encoder 102 or the decoder 104. Those skilled in the art should appreciate that the operations of FIG. 2 may be alternatively modified according to architectures shown in FIG. 3 or FIG. 4.

In some embodiments, the verification of the pattern generator 302, the mux 304, the XOR unit 402 and the error pattern generator 404 may be also accomplished by circuit duplication or using other self-checking embedded logic designs. For example, to verify the XOR unit 402, the result of the XOR unit 402 may be compared with a result produced by a duplicated XOR unit, or implementing the XOR unit 402 by employing an XOR unit having a self-checking function.

Some embodiments of the present disclosure provide a memory system having an error correction codes (ECC) self-checking function, including: an ECC encoder, used to convert input information bits into a codeword; a memory, coupled to the ECC encoder, the memory being used to store the codeword; and an ECC decoder, coupled to the memory and the ECC encoder, the ECC decoder being used to generate a syndrome of the codeword; wherein when the memory system is operated in an on-line self-checking mode and the codeword is fed into the memory from the ECC encoder, the codeword is as well fed into the ECC decoder from the ECC encoder to generate the syndrome.

Some embodiments of the present disclosure provide a memory system having an error correction codes (ECC) self-checking function, including: a pattern generator for generating predetermined input information bits; an ECC encoder, coupled to the pattern generator and being used to convert the predetermined input information bits into a codeword; a memory, coupled to the ECC encoder, the memory being used to store the codeword; an ECC decoder, coupled to the memory and the ECC encoder, the ECC decoder being used to generate a syndrome of the codeword; and wherein when the memory system is operated in an off-line self-checking mode, the codeword is fed into the ECC decoder from the ECC encoder to generate the syndrome.

Some embodiments of the present disclosure provide an error correction codes (ECC) self-checking method for a memory system, including: converting input information bits into a codeword; generating a syndrome of the codeword without passing through a memory of the memory system; and generating a corrected codeword according to the syndrome.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory system having an error correction codes (ECC) self-checking function, comprising:
    an ECC encoder, used to convert input information bits into a codeword;
    a memory, coupled to the ECC encoder, the memory being used to store the codeword received from the ECC encoder;
    an ECC decoder, coupled to the memory and the ECC encoder, the ECC decoder being used to generate a syndrome of the codeword; and
    a first mux, having a first input node, a second input node and an output node, the first mux being used to selectively couple the first input node or the second input node to the output node, wherein the first input node is arranged for receiving the codeword from the ECC encoder without passing through the memory, the second input node is arranged for receiving the codeword stored in the memory, and the output node is coupled to the ECC decoder;
    wherein when the memory system operates in an on-line self-checking mode and the codeword is fed into the memory from the ECC encoder, the first mux couples the first input node to the output node such that the codeword is as well fed into the ECC decoder from the ECC encoder without passing through the memory to generate the syndrome, and the ECC decoder decodes the codeword not passing through the memory to generate the syndrome so as to identify if at least one fault is induced inside at least one of the ECC encoder and the ECC decoder.

2. The memory system of claim 1, wherein when the on-line self-checking mode is disabled, the first mux is configured to couple the second input node to the output node.

3. The memory system of claim 2, further comprising a checking logic coupled to the ECC decoder, the checking logic configured to indicate if the codeword is invalid according to the syndrome.

4. The memory system of claim 1, wherein a self-checking result of the ECC encoder and the ECC decoder is determined according to the syndrome.

5. The memory system of claim 1, further comprising a correction unit coupled to the ECC encoder and the ECC decoder.

6. The memory system of claim 5, wherein the correction unit is used to generate a corrected codeword according to the syndrome.

7. The memory system of claim 5, further comprising a second mux coupled between the correction unit, the memory and the ECC encoder.

8. The memory system of claim 7, wherein the second mux selectively feeds the codeword into the decoder from the ECC encoder.

9. The memory system of claim 5, wherein a self-checking result of the correction unit is determined according to a comparison result of the codeword and the corrected codeword.

10. A memory system having an error correction codes (ECC) self-checking function, comprising:
    a pattern generator for generating predetermined input information bits;
    an ECC encoder, coupled to the pattern generator and used to convert the predetermined input information bits into a codeword;
    a memory, coupled to the ECC encoder, the memory being used to store the codeword received from the ECC encoder;
    an ECC decoder, coupled to the memory and the ECC encoder, the ECC decoder being used to generate a syndrome of the codeword; and
    a first mux, having a first input node, a second input node and an output node, the first mux being used to selectively couple the first input node or the second input node to the output node, wherein the first input node is arranged for receiving the codeword from the ECC encoder without passing through the memory, the second input node is arranged for receiving the codeword stored in the memory, and the output node is coupled to the ECC decoder;
    wherein when the memory system operates in an off-line self-checking mode, the first mux couples the first input node to the output node such that the codeword is fed into the ECC decoder from the ECC encoder without passing through the memory to generate the syndrome, and the ECC decoder decodes the codeword not passing through the memory to generate the syndrome so as to identify if at least one fault is induced by at least one of the ECC encoder and the ECC decoder.

11. The memory system of claim 10, further comprising a second mux coupled between the pattern generator and the ECC encoder.

12. The memory system of claim 11, wherein the second mux selectively feeds the predetermined input information bits into the ECC encoder.

13. The memory system of claim 10, wherein a self-checking result of the ECC encoder and the ECC decoder is determined according to the syndrome.

14. The memory system of claim 10, further comprising a correction unit coupled to the ECC encoder and the ECC decoder for generating a corrected codeword according to the syndrome.

15. The memory system of claim 14, further comprising a second mux coupled between the correction unit, the memory and the ECC encoder for selectively feeding the codeword into the decoder from the ECC encoder.

16. The memory system of claim 14, wherein a self-checking result of the correction unit is determined according to a comparison result of the codeword and the corrected codeword.

17. The memory system of claim 14, further comprising an error pattern generator to contaminate the codeword before feeding to the ECC decoder and the correction unit.

18. An error correction codes (ECC) self-checking method for a memory system, comprising:
utilizing an ECC encoder to convert input information bits into a codeword;
controlling a mux to couple the ECC encoder to an ECC decoder to provide a path not including a memory of the memory system, the mux arranged to selectively couple one of the ECC encoder and the memory to the ECC decoder;
feeding the codeword into the ECC decoder through the path not including the memory of the memory system;
utilizing the ECC decoder to generate a syndrome of the codeword not passing through the memory;
utilizing a correction unit of the memory system to generate a corrected codeword according to the syndrome; and
comparing the corrected codeword with the codeword not passing through the memory to identify if at least one hardware fault is induced by the correction unit.

19. The ECC self-checking method of claim 18, further comprising:
determining an ECC self-checking result according to the syndrome.

20. The ECC self-checking method of claim 18, further comprising:
generating an error pattern to contaminate the codeword.

\* \* \* \* \*